United States Patent [19]

Ballou et al.

[11] Patent Number: 4,757,463
[45] Date of Patent: Jul. 12, 1988

[54] FAULT ISOLATION FOR VEHICLE USING A MULTIFUNCTION TEST PROBE

[75] Inventors: Richard V. Ballou, Troy, Mich.; Joseph A. Boscove, Highland Beach, Fla.; Richard A. Kraus, Coral Springs, Fla.; Hobart L. Kurtz, Boca Raton, Fla.; Peter Langer, Coral Springs, Fla.; Kenneth M. Nicolson, Boca Raton, Fla.

[73] Assignee: International Business Machines Corp., Armonk, N.Y.

[21] Appl. No.: 869,870

[22] Filed: Jun. 2, 1986

[51] Int. Cl.⁴ .......................................... G06F 15/74
[52] U.S. Cl. ................................... 364/551; 364/424; 364/431.01; 364/431.11; 73/117.2
[58] Field of Search .................. 364/550, 551, 431.01, 364/424, 431.11; 73/116–117.3

[56] References Cited

U.S. PATENT DOCUMENTS

| | | | |
|---|---|---|---|
| 4,125,894 | 11/1978 | Cashel et al. | 364/442 |
| 4,234,921 | 11/1980 | Kinoshita et al. | 364/424 |
| 4,267,569 | 5/1981 | Baumann | 364/431 |
| 4,270,174 | 5/1981 | Karlin et al. | 364/551 |
| 4,295,363 | 10/1981 | Buck et al. | 73/117.3 |
| 4,375,672 | 3/1983 | Kato et al. | 364/551 |
| 4,404,639 | 9/1983 | McGuire et al. | 364/551 |
| 4,418,388 | 11/1983 | Allgor et al. | 364/431.01 |
| 4,441,359 | 4/1984 | Ezoe | 73/117 |
| 4,467,323 | 8/1984 | Kling et al. | 340/721 |
| 4,476,531 | 10/1984 | Marino et al. | 364/431.01 |

OTHER PUBLICATIONS

Booklet: "The Guide" (Personal Computer), vol. IV, 1985, International Business Machines Corp., front and back covers, pp. 8, 10, 11, 31.34, 36.
Book: "Programmer's Guide to the IBM PC", Peter Norton, 1985, Microsoft Press, Contents, pp. 5, 6, 7, 12, 42–44, 68, 102–106, 130, 143, 144.
Book: "Electronic Engine Controls", Chilton Book Co., 1985 Frontispiece, Contents, pp. 38–41, 239–259, 274, 275.
Article: "Specific Cell Location Assembly for Displays", R. V. Ballou et al., IBM Technical Disclosure Bulletin, Feb. 1985, vol. 27, No. 9, pp. 5104–5106.
Article: "Computerized Diagnostic Tester at Hand", Electrical World, Aug. 1, 1975, pp. 36–38.
Article: "A Digital Electronic System for Automobile Testing and Diagnosis", T. A. Cross, IEE Conference Jul. 6–9, 1976, London, England, pp. 152–159.

Primary Examiner—Parshotam S. Lall
Assistant Examiner—Thomas G. Black
Attorney, Agent, or Firm—Richard A. Tomlin

[57] ABSTRACT

In a computerized automotive vehicle diagnostic system, a test probe cable is attached to individual components and consists of a multiple conductor cable which is attached ultimately to the component and to a computer in a technician terminal. Where the probe cable enters the technician terminal the conductors contained within it are fed into a programmable crosspoint switch which is controlled by a microcontroller. Test functions are provided by three programmable resources: (1) A program controlled multimeter, (2) A program controlled DC voltage source and ground sink; and (3) the microcontroller itself which receives and interprets commands from the computer and controls the various probe elements based upon the test commands received.

6 Claims, 14 Drawing Sheets

ALDL CABLE

PROBE CABLE

ECM TO TPS CIRCUIT

FIG. 10

A — FAULT TABLE (15a): 002, 009, 016, 113, 230, 232

B — FAULT ANALYSIS TABLE (17a)

| FAULT CODES | | | FIPS TO EXECUTE | | | |
|---|---|---|---|---|---|---|
| 401 | 637 | 697 | 101 | 102 | | |
| 401 | 697 | | 101 | 102 | 137 | |
| 401 | | | 101 | 102 | 137 | 146 |
| 002 | 113 | 406 | 051 | 030 | | |
| 002 | 113 | | (030) | (097) | | |
| 113 | | | 030 | (011) | 097 | |
| 230 | 231 | 232 | 137 | 402 | | |
| 230 | | | (402) | (404) | (403) | (406) |
| 232 | | | 403 | 406 | (401) | |
| ···· | | | | | | |

C — FIPS EXECUTED UNTIL THE PROBLEM IS FIXED (21a): 030, 097, 011, 402, 404, 403, 406, 401

FIG. 16

PROBE TABLE ENTRY FORMAT

| LABEL | CMD | C1 | C2 | TIME | SLOPE | RESULT | LOSIG | HISIG | ENTRY | PRNAME | SEQCODE |
|---|---|---|---|---|---|---|---|---|---|---|---|
| X | READ VOLT | X | X | X |  | X | X | X | # | # | X |
| X | READ RESIST | X | X | X |  | X | X | X | # | # | X |
| X | READ AMP | X |  |  |  | X | X | X | # | # | X |
| X | READ FREQ | X |  |  |  | X | X | X | # | # | X |
| X | READ DUTY CYCLE | X |  |  |  | X | X | X | # | # | X |
| X | READ TIMING | X | X |  | X | X | X | X | # | # | X |
| X | SOURCE VOLTS | X | VOLT LVL | X |  |  |  |  |  |  | X |
| X | APPLY GROUND | X |  | X |  |  |  |  |  |  | X |
| X | SOURCE PWM | X | PWM TYPE | X |  | SIGNAL AMP | SIGNAL FREQ | DUTY CYCLE |  |  | X |
| X | REMOVE | X |  |  |  |  |  |  |  |  | X |
| X | READ ALDL BYTE | BYTE NO. |  |  |  | X | X | X | # | # | X |
| X | READ ALDL BIT | BYTE NO. | AND Or OR |  |  | X | BIT MASK |  | # | # | X |
| X | READ DIGITL |  |  |  |  | X | X | X | # | # | X |

FAULT ISOLATION FOR VEHICLE USING A MULTIFUNCTION TEST PROBE

CROSS REFERENCE TO RELATED APPLICATION

Cross reference is made to the following patent application, such application having a common filing data and common assignee with the present application:

U.S. patent application Ser. No. 869,870, entitled "Computer Assisted Vehicle Service Featuring Signature Analysis and Artificial Intelligence", with J. A. Boscove et al as inventors.

PRIOR ART REFERENCES

The following prior art references are of interest and are referred to in the specification. The first four references are specifically incorporated by reference herein.

1. Booklet: "The Guide" (Personal Computers), Volume IV, 1985, International Business Machines Corporation. Front and back covers, Pp. 8, 10, 11, 31, 34, 36.
2. Book: "Programmer's Guide to the IBM PC", Peter Norton 1985, Microsoft Press, Contents, Pp. 5, 6, 7, 12, 42–44, 68, 102–106, 130, 143, 144.
3. Book: "Electronic Engine Controls", Chilton Book Co., 1985, Frontispiece, Contents, Pp. 38–41, 239–259, 274–275.
4. Article: "Specific Cell Location Assembly for Displays" R. V. Ballou et al, IBM Technical Disclosure Bulletin February 1985, Vol. 27, No. 9, Pp. 5104–5106.
5. Article: "Computerized Diagnostic Tester at Hand", Electrical World, Aug. 1, 1975, Pp. 36–38.
6. Article: "A Digital Electronic System for Automobile Testing and Diagnosis", T. A. Cross, IEE Conference July 6–9, 1976 London, England, Pp. 152–159.
7. U.S. Pat. No. 4,267,569 entitled "Micro-Computer System for Control and Diagnosis of Motor Vehicle Functions" with H. Baumann, as inventor.

BACKGROUND OF THE INVENTION

This invention relates to computerized automotive vehicle diagnostic system and more particularly to a more efficient apparatus of this nature having improved performance in relation to the testing and locating of faulty components by a technician.

Microcomputers, electronic sensors and other components are incorporated into vehicles to monitor and control engine operations and other functions.

The increasing amount of electronic, electrical and electro-mechanical content in automobile designs has created a severe problem for the vehicle servicing environment. The service tools available for servicing do not provide the capabilities needed to diagnose and repair problems which are directly or indirectly related to the electronics. This has resulted in long diagnostic times, incorrect repairs and multiple service visits for the same problem.

Considering the prior art references noted above, Reference 1, "The Guide" describes an IBM Personal Computer AT that is a useful element in the diagnostic system set forth herein. Reference 2, the Norton book, illustrates various characteristics of the IBM Personal Computer AT such as programming, the microprocessor, keyboard, etc. Reference 3, the Chilton book, describes engine control modules and systems that that are utilized herein. Reference 4, the Ballou et al article, describes a representative touch panel that may be used in the practice of the invention. References 5 and 6 relate to computer-based diagnostic systems for engines and are merely representative of prior systems. Applicants' system procedures are distinctively different from those systems.

The Baumann patent, Reference 7, describes the use of an adapter plug but it is intended for monitoring a vehicle, not for control and monitoring as set forth herein.

The primary objective of the present invention is to provide semi-automated diagnostic apparatus for vehicles, such apparatus incorporating computer diagnostics.

SUMMARY OF THE INVENTION

In a computerized automotive vehicle diagnostic system, a test probe cable is provided that is connected for testing individual components and that consists of a multiple conductor cable which is attached ultimately to a selected component and to a computer in a technician terminal. At the point where the probe cable enters the terminal the conductors contained within it are fed into a programmable crosspoint switch which is controlled by the computer. Test functions are provided by three programmable resources in the controller: (1) A program controlled multimeter capable of measuring at least voltage and resistance, (2) A program controlled DC voltage source and ground sink; and (3) A micro controller for receiving and interpreting commands from processor and for controlling the various probe elements based upon the test commands received.

A diagnostic technique and hardware arrangement is incorporated within the technician terminal that provides the ability to isolate faults quickly and accurately with a minimum of technician intervention and with no technician decisions to be made.

Existing methods of isolating faulty electrical/electronic components on vehicles, using hand held tools and paper flow charts is time consuming and frequently results in inaccurate diagnosis and repair. This leads to high warranty costs for the manufacture and causes customer dissatisfaction. In a product, such as the technician terminal disclosed in the reference which is designed to assist a service technician in the diagnosing and repairing of faults which occur in the electronic and electrical components of vehicles, there is a need to provide a facility that will quickly and accurately test whether a suspected component is good or bad. Due to the complex nature of the components and the interdependencies that exist between them many of the faults detected during the fault detection procedure result in a list of suspected malfunctioning components. Each of the suspected components must be tested until the faulty component is found.

In the present disclosure, a set of hardware and software systems, incorporated within the technician terminal provide the ability to isolate faults quickly and accurately with a minimum of technician intervention and with no technician decisions to be made. These systems also provide the means to capture test readings and test results which when communicated to a host system along with other data captured during the fault detection phase, can be statistically analyzed with the results being used to improve the overall diagnostic capability of the terminal.

The apparatus involved is used during the isolation phase of the vehicle service procedure defined in the cross-referenced J. A. Boscove et al patent application.

The apparatus consists of:
1. A cable attached test probe.
2. A probe controller card in the terminal, containing a multiplicity of digital and analog circuit chips.
3. Probe test tables resident in terminal storage, which contain the parameters used in performing a component test.
4. Fault isolation procedures which execute on the terminal computer to perform the component test.

For a better understanding of the present invention, together with other and further advantages and features thereof, reference is made to the description taken in connection with the accompanying drawings, the scope of the invention being pointed out in the appended claims.

BRIEF DESCRIPTION OF THE DRAWINGS

Referring to the drawings:

FIGS. 10A, B, and C illustrate tables as they are organized in an alternative diagnostic procedure.

FIG. 16 is a format table of test table entry field definitions.

ABBREVIATIONS

The following abbreviations are occasionally used herein:

| Abbreviation | Definition |
|---|---|
| CMD | Command |
| LOSIG | Low Signal |
| HISIG | High Signal |
| PRNAME | Procedure Name |
| SEQCODE | Sequence Code |
| LVL | Level |
| SIGNAL AMP | Signal Amplitude |
| SIGNAL FREQ | Signal Frequency |
| PWM TYPE | Pulse Width Modulation Type |
| READ RESIST | Read Resistance |
| READ AMP | Read Amplitude |
| READ VOLT | Read Voltage |

DETAILED DESCRIPTION

A technique is described herein which makes use of a computer based technician terminal that connects to a vehicle being serviced using the assembly line data link (ALDL). This data link is used by the various vehicle manufacturers to test the vehicle at the end of the assembly lines. It allows an off-board computer to communicate with the computers on-board the vehicle. When commanded, the on-board computer outputs data frames on the data link which contain information about the state of the various sensors, switches, relays and actuators that are controlled by the on-board computers. Included in the data are error codes representing faults detected and stored by the on-board computers.

Figure 1:
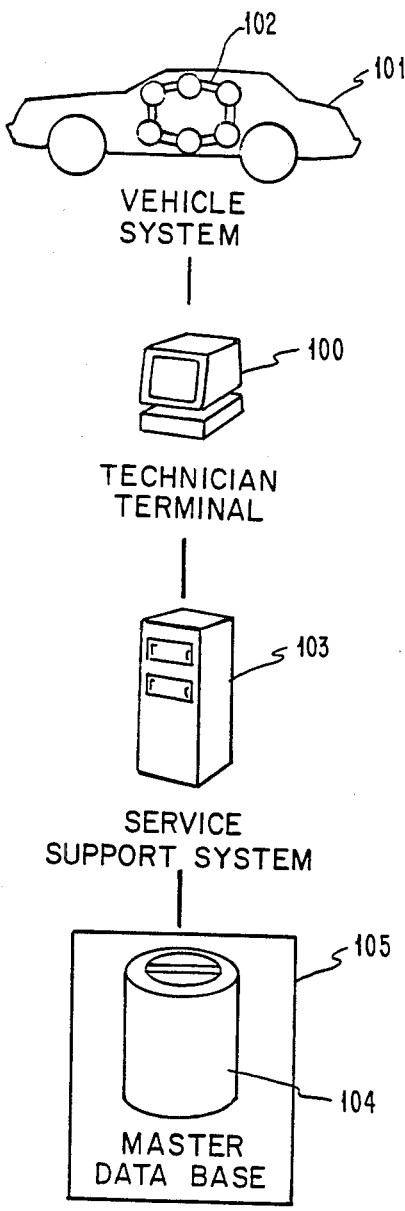
FIG. 1 illustrates a network in which one or more technician terminals such as that described herein may be connected.

The network of FIG. 1 includes a technician terminal 100 interfaced with a vehicle 101 and more specifically with the vehicle computer control system 102. Terminal 100 has a data entry facility and touch interactive/-menu driven display, and also incorporates a computer such as the IBM Personal Computer AT, Prior Art References 1 and 2. A touch panel for the technician terminal is like that described in the Ballou et al Prior Art Reference 4. The computer control system 102 is like the control systems described in the Chilton Prior Art Reference 3, as further illustrated in FIG. 2 herein.

Service Support System 103, FIG. 1, may support one or more technician terminals and serve as a regional vehicle data base. A host computer 105 master data base 104 acts as a service support system interface to the user company headquarters, provides network management and supplies realtime feedback to manufacturing and engineering groups, for example. Alternatively, the technician terminals may be connected directly to the host computer 105 and data base 104.

The automotive industry has for the past several years incorporated microcomputers, electronic sensors and many electro-mechanical components into vehicle designs to provide better monitoring and control of the engine operations. More electronics are being added to provide control for other functions as well. Transmission, radio, heat/ventilation/air conditioners, instrument panels, memory seats and mirrors, etc. are some examples. Future designs will include ever increasing amounts of hi-tech features such as cellular radio telephone, vehicle attitude, collision avoidance, etc.

Figure 2:
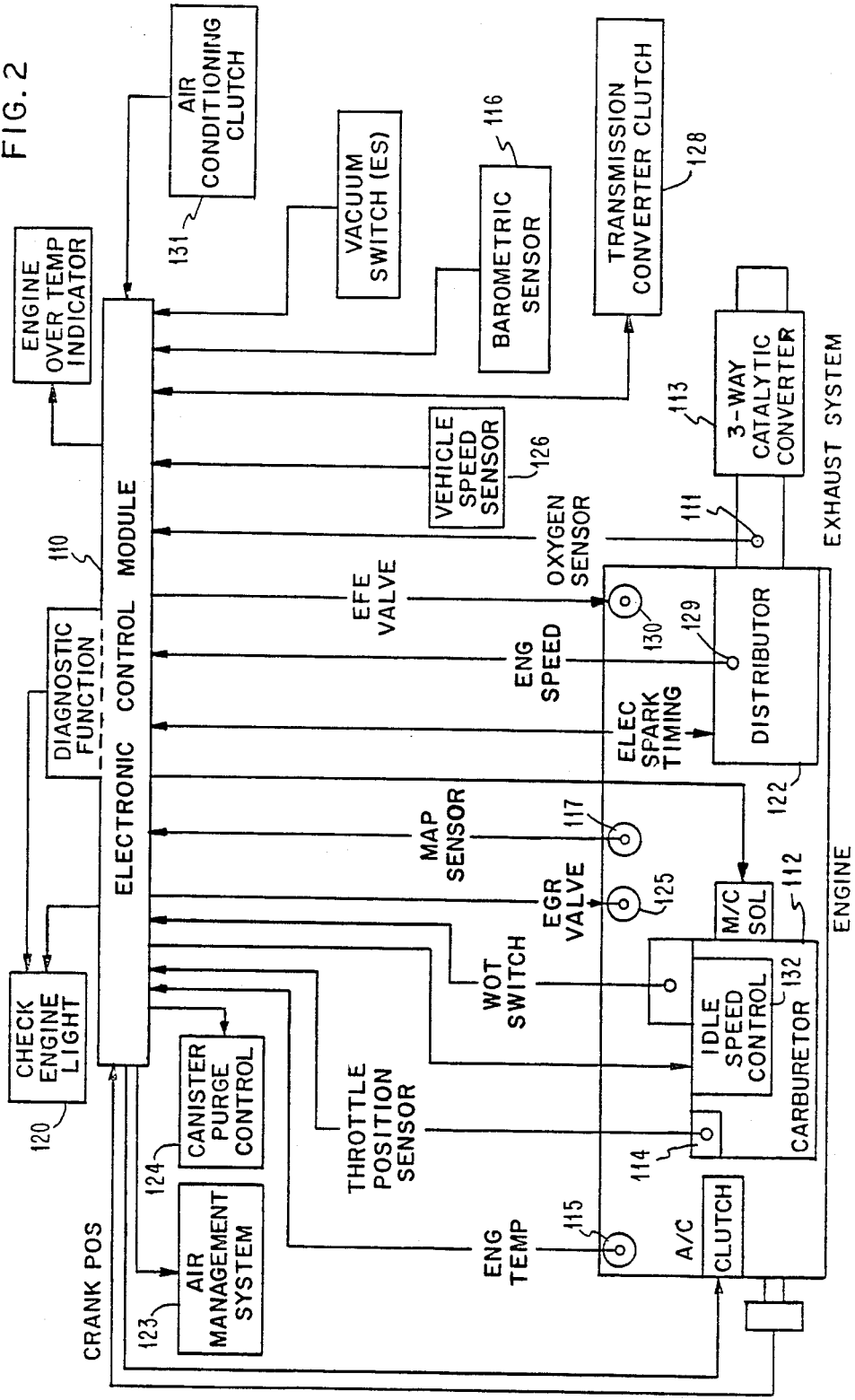
FIG. 2 illustrates an engine control system for use on a vehicle shown in FIG. 1.

FIG. 2 illustrates an engine control system used in General Motors (GM) vehicles since the 1981 model year and designated the Computer Command Control (CCC) system. This system has many components in common with the earlier GM system referred to as the Computer Controlled Catalytic Converter (C-4) system. These include the Electronic Control Module (ECM) 110, which is capable of monitoring and adjusting more sensors and components than the ECM used on the C-4 system, an oxygen sensor 111, an electronically controlled variable-mixture carburetor 112, a three way catalytic converter 113, throttle position sensor 114 and temperature sensor 115, coolant, a barometric pressure (BARO) sensor 116, a manifold absolute pressure (MAP) sensor 117, a "Check Engine" light 120 on the instrument cluster, and an Electronic Spark Timing (EST) distributor 122, which on some engines (turbocharged) is equipped with an Electronic Spark Control (ESC) that retards ignition spark under some conditions (detonation, etc.).

Other components used by the CCC System includes the Air Injection Reaction (AIR) Management System 123, charcoal canister purge solenoid 124, Exhaust Gas Recirculation (EGR) valve control 125, engine speed sensor 129, transmission torque converter clutch solenoid 128 (automatic transmission models only), idle speed control 132, and early fuel evaporative (EFE) system 130.

The ECM 110, in addition to monitoring sensors and sending a control signal to the carburetor, also controls the following components or sub-systems: charcoal canister purge control 124, AIR Management System 123, idel speed control 132, automatic transmission converter clutch 128, distributor 122 ignition timing, EGR valve control 125, EFE control 130, and the air conditioner compressor clutch 131. The CCC ECM is equipped with a PROM assembly similar to the one used in the C-4 ECM.

The Air Management System 123 is an emission control that provides additional oxygen either to the catalyst or the cylinder head ports (in some cases exhaust manifold), is composed of an air switching valve and/or an air control valve, controls the air pump flow and is itself controlled by the ECM 110.

The charcoal canister purge control 124 is an electrically operated solenoid valve controlled by ECM 110 and when energized, blocks vacuum from reaching the canister purge valve. When ECM 110 de-energizes the purge control solenoid, vacuum is allowed to reach the canister and operate the purge valve. This releases the fuel vapors collected in the canister into the induction system.

The EGR valve control solenoid 125 is activated by ECM 110. When the engine is cold, the ECM energizes the solenoids. This blocks the vacuum signal to the EGR valve 125. When the engine is warm, the ECM de-energizes the solenoid and the vacuum signal is allowed to reach and activate the EGR valve.

The Transmission Converter Clutch (TCC) 128 lock is controlled by the ECM 110 through an electrical solenoid in the transmission. When the vehicle speed sensor in the instrument panel signals the ECM that the vehicle has reached the correct speed, the ECM energizes the solenoid which allows the torque converter to mechanically couple the engine to the transmission. When the brake pedal is pushed or during deceleration, passing, etc., the ECM returns the transmission to fluid drive.

The idle speed control 132 adjusts the idle speed to load conditions, and lowers the idle speed under no-load or low-load conditions to conserve gasoline.

The Early Fuel Evaporative (EFE) system 130 used on some engines provides rapid heat to the engine induction system to promote smooth start-up and operation.

As noted, the service tools heretofore available for servicing have not provided the necessary capabilities needed to diagnose and repair problems which are directly or indirectly related to the vehicle electronics. As a result, these have been long diagnostic times, incorrect repairs and multiple service visits for the same problem.

Figure 3:
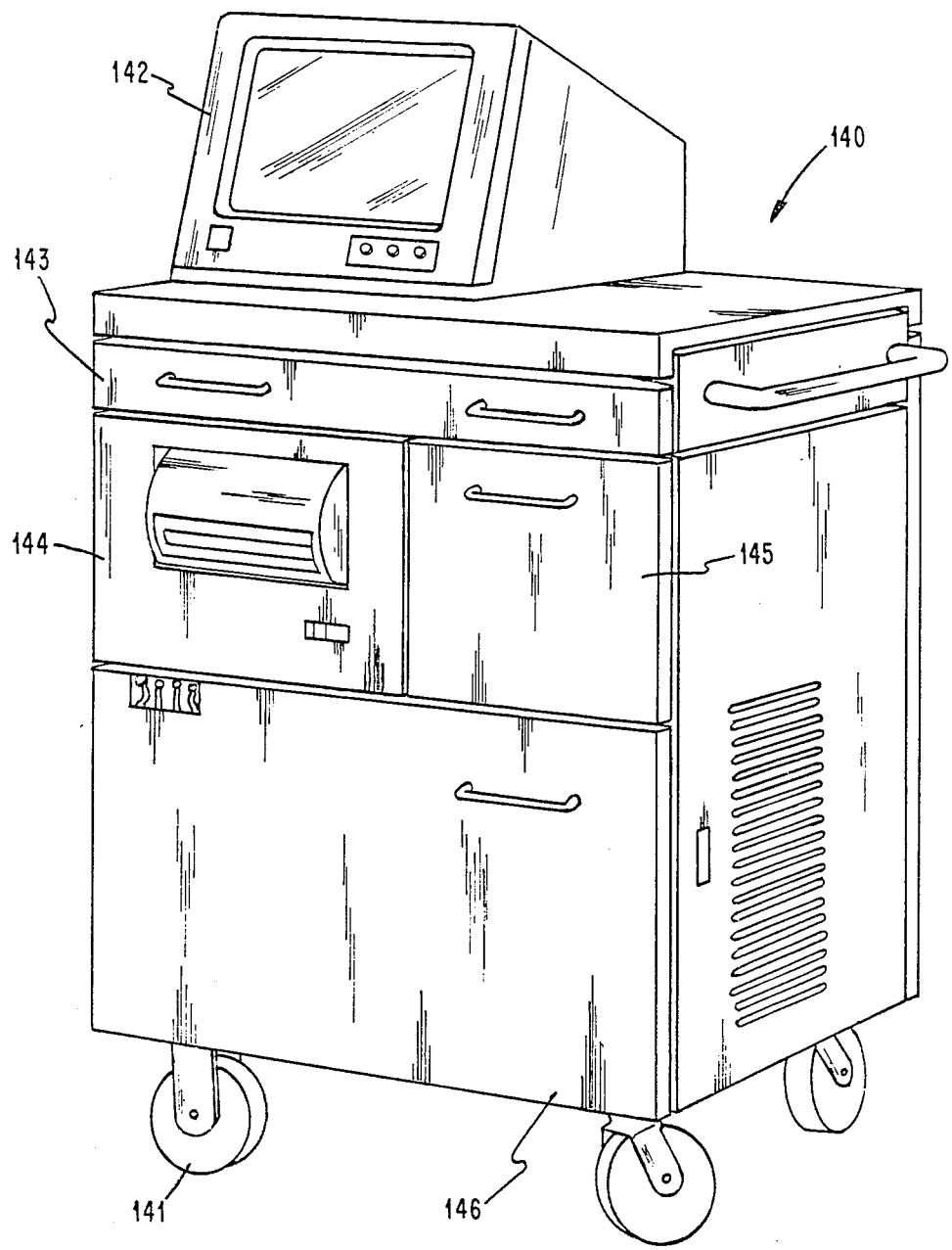
FIG. 3 is a perspective view of the technician terminal in a console configuration.
Figure 4:
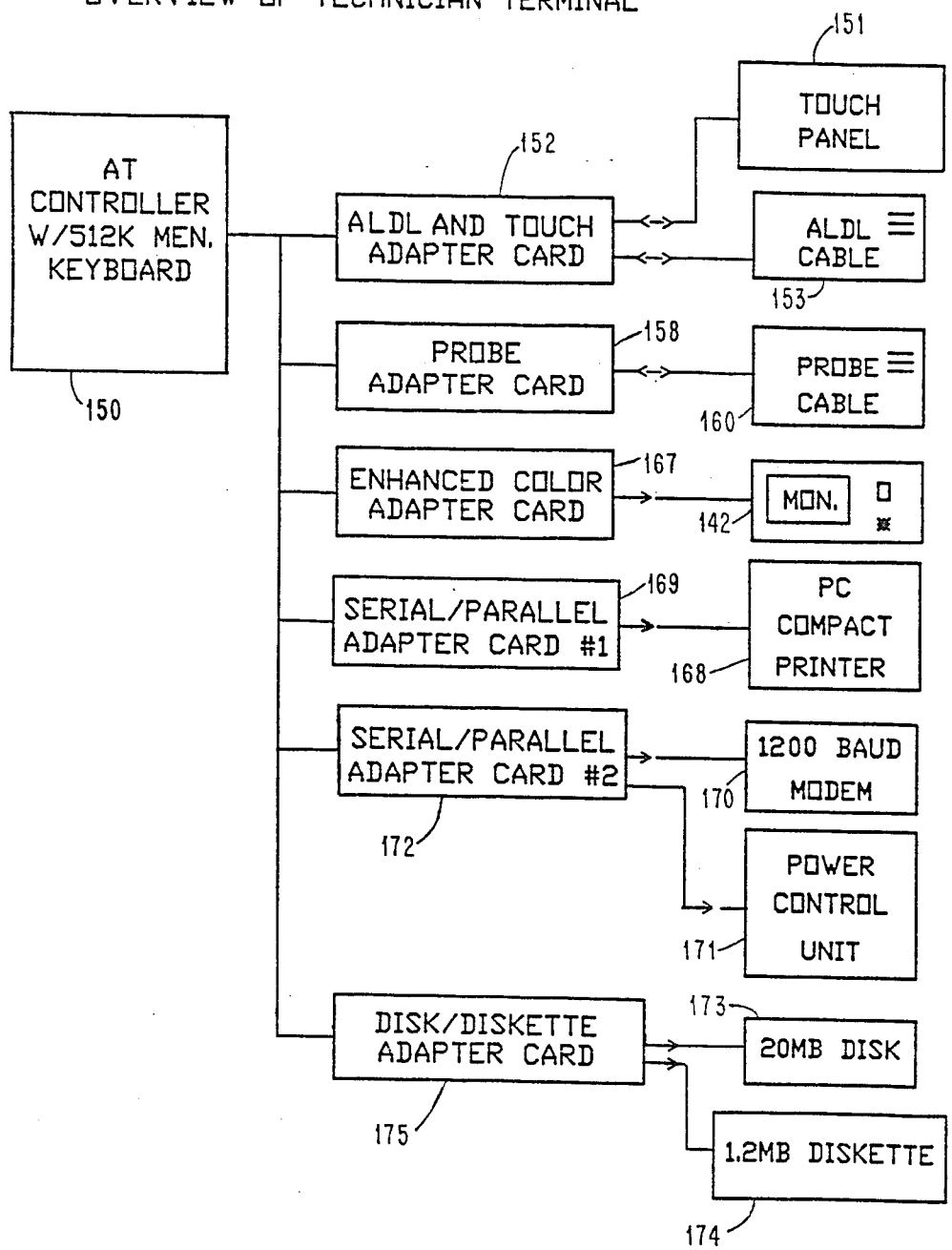
FIG. 4 is a block diagram of the major components in the technician terminal.

The technician terminal FIGS. 3 and 4, is designed to overcome these problems and may typically incorporate the following elements:
PC/AT Based Controller
512 KB Memory
1.2 MB 5.25 Diskette Drive
20 MB Fixed Disk Drive
13" Color Monitor
Infrared (I/R) Touch Panel
Communications Card
ALDL Attachment Card and Cables
Probe Attachment Card and Cables
Printer
Mobile Work Station
Fault Isolation Repair Procedure Program Executor (FEX) Diagnostic Executive
Remote Update Facility
FEX Development System (FDS)

In FIG. 3, the technician terminal is housed in a console 140 mounted on wheels, such as wheel 141, for greater mobility. Console 140 has a display monitor 142 integrally incorporated therewith, monitor 142 having an infrared touch panel on the face thereof. A keyboard, such as the PC AT keyboard, is incorporated within drawer 143. The console also has a printer 144. Drawers 145 and 146 are provided for storage, drawer 146 for accommodating cables, for example.

Figure 5:
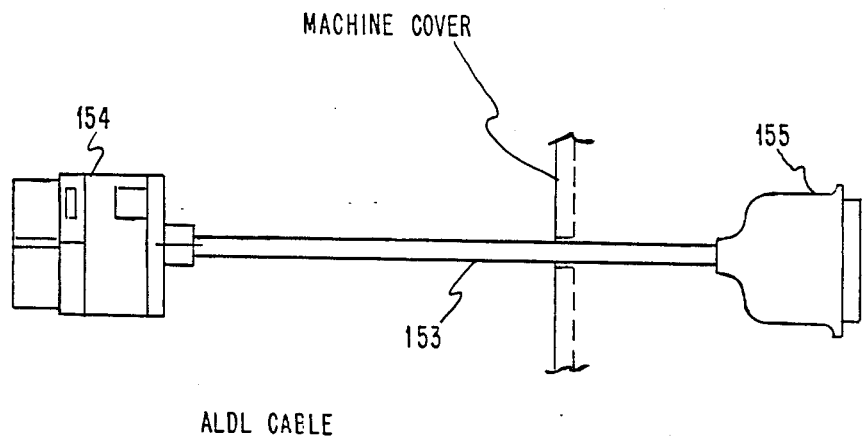
FIGS. 5, 6 and 7 illustrate various cables for use with the technician terminal.

FIG. 4 is an overview of the internal interconnections and primary elements in the technician terminal. This includes the PC AT controller 150, infrared touch panel 151 associated with the display monitor 142, an ALDL and touch adapter Card 152, which besides panel 151 inputs, receives input signals from the on-board ECM by way of the ALDL cable 153, also shown in FIG. 5. Cable 153 has connectors 154 and 155 as shown in FIG. 5 for interconnection of the technician with the ECM.

Figure 6:
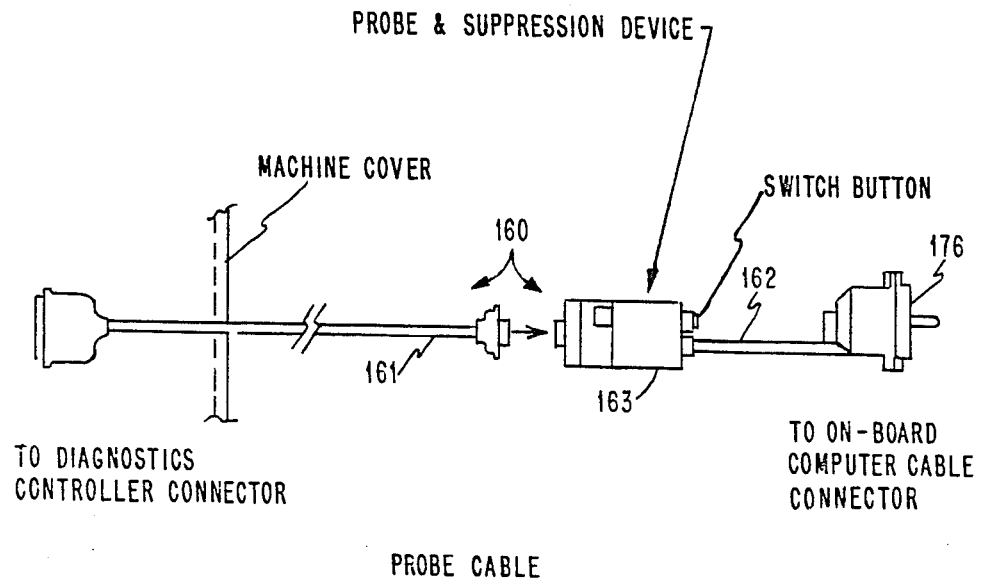

A probe adapter card 158 receives signals from a probe cable 160, also shown in greater detail in FIGS. 6 and 8.

In FIG. 6, probe cable 160 comprises portions 161 and 162 as well as a device 163 for use by the technician during diagnostics as more fully described subsequently herein.

Figure 8A:
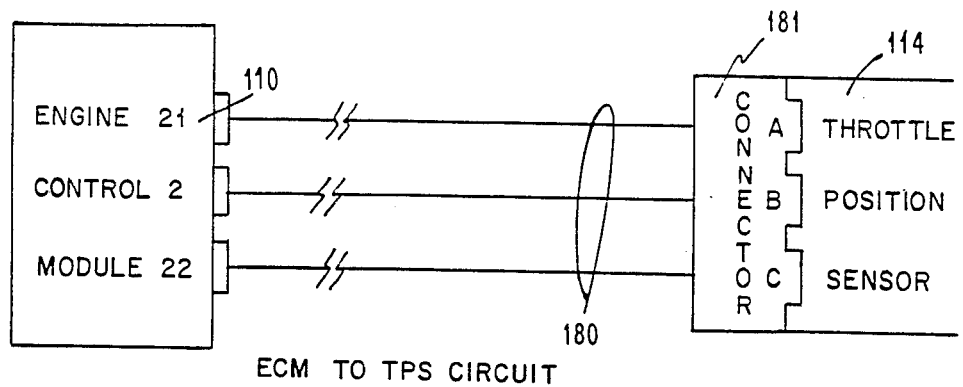
FIGS. 8A and 8B illustrate interposer cable usage in conjunction with the cable of FIG. 6.
Figure 8B:
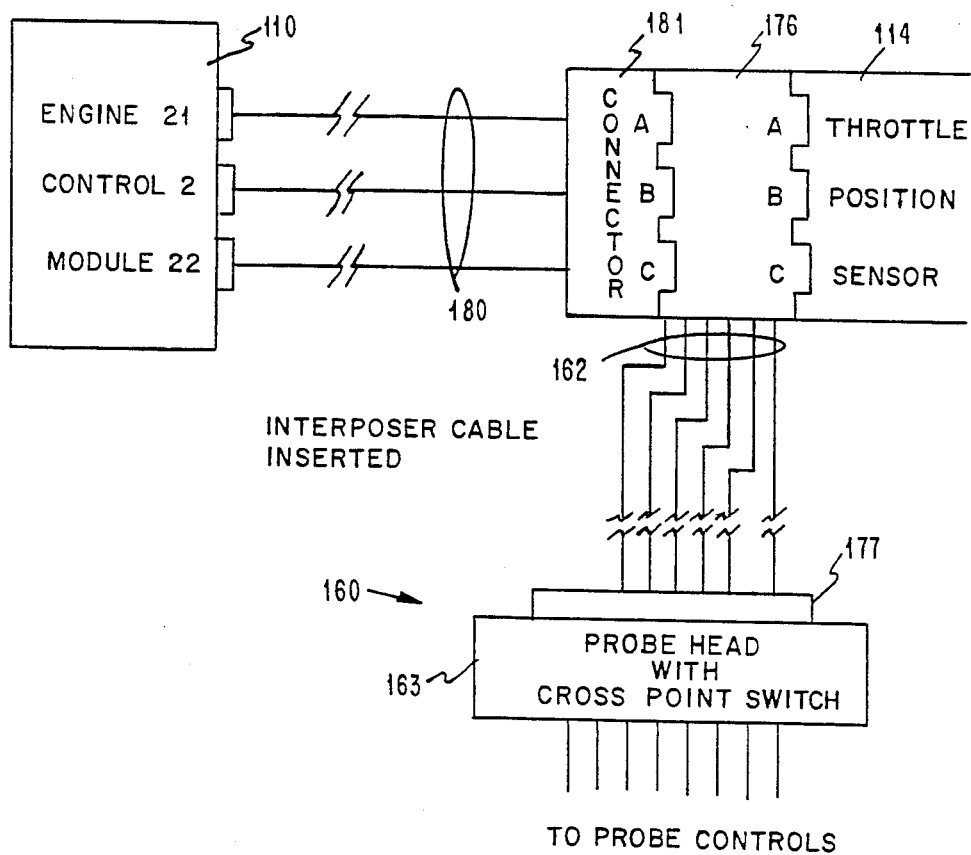

FIGS. 8A and 8B illustrate the attachment of the test probe cable 160 to a component. Normally ECM 110 is connected to component 114 by way of cable 180 with connector 181. As mentioned, Probe 160 consists of a multiple conductor cable attached to the probe controller through adapter card 158 and terminated externally at a zero force insertion type connector 176, shown diagrammatically in FIG. 8B. The attachment of the probe to a component to be tested such as throttle position sensor 114 is accomplished by use of cables having the component connector 176 on one end and a connector 177 which mates with the test probe head 163 on the other end. This cable is called a vehicle probe interface (VPI). The connector 176 of the VPI cable is inserted in line with the component to be tested and the other connector 177 is plugged into the probe head.

Figure 7:
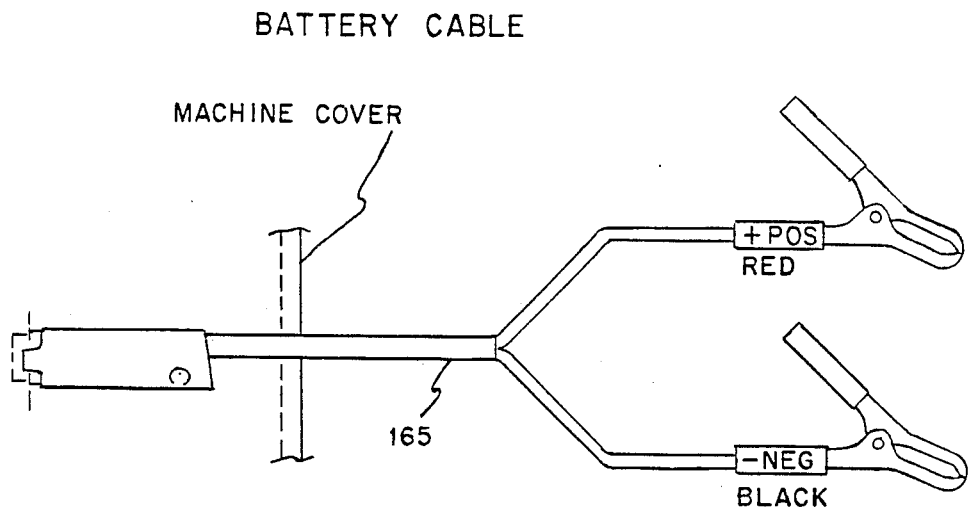

The technician terminal, may for battery checking purposes, incorporate a battery cable 165, FIG. 7.

An enhanced color adapter card 167, FIG. 4, is connected to monitor 142 for output of display signals. A printer 168 is driven by way of another adapter card (#1) designated 169, while a modem 170 and power control unit 171 are connected to controller 150 by way of adapter card (#2) designated 172. Modem 170 can be an internal modem rather than external as shown. Both a 20 megabyte hard disk file 173 and a 1.2 megabyte floppy diskette file 174 are accommodated by adapter card 175.

The infrared touch panel and display 142 interface with the IBM PC AT electronics for technician input. The multi-function measurement cables/probes 153,160 supported by adapter cards 152 and 158 are adapted to be used by the technician in diagnosing and isolating a vehicle failure.

Functions performed by probe 160 are controlled by Vehicle Service Procedures programmed in controller 150 which interactively request the technician to take readings, inject source voltage/ground or verify operational circuits.

The ALDL and touch adapter card 152 located in the technician terminal reads data presented to the ALDL connector from the vehicle ECM and formats the data in a standard manner acceptable to the PC. Card 152 is programmable and accommodates various wiring configurations, data structures, and line speeds.

A FEX Development System (FDS) is used that involves PC utility programs that run on the IBM PC to support development of Vehicle Service Procedures. Examples of the utility programs are:

Table Generator
Procedure Generator
Service Bulletin Generator
File Utilities

The Fault Isolation Repair Procedure Program Executor (FEX) is the systems control program that operates the Technician Terminal. The Vehicle Service Procedures operate under control of FEX to perform the following functions:

Guide Technician through service procedures
Retrieve and store data
Execute diagnostic procedures
Build and display panels
Control Test Proble operations
Control ALDL Interface In the technique disclosed herein, programs executing on the off-board computer in the technician terminal 140, FIGS. 3 and 4, by use of a visual display, prompt the technician to change the vehicles state. For each state change a sequence of tests are executed comparing information from the data streams against known good signatures. The signature analysis include interrogation of single parameters and the correlation of multiple parameters.

In the service environment, where more time can be allocated for testing than that allowed at the end of an assembly line, enhanced versions of the end of line test programs can be executed to provide detection capability for more vehicle problems. Building on this ability to detect faults with a computer, the present system design describes how, by the use of artificial intelligence concepts, a technician terminal can become "smarter" in it's ability to diagnose more vehicle problems. Also, as described herein, a multi-function program controlled probe supports fault isolation to the component to be replaced, repaired or adjusted. The system structure defines a hierarchical set of programs which utilize the contents of tables that specify what vehicle states to set, which tests to run, which signatures to use, and what repair actions to take.

The technician terminal would usually be incorporated in the communications network, FIG. 1. The network connects all technician terminals to the data base in the support system 103, FIG. 1, and to the host computer 105 which collects statistics on a periodic basis, relative to the repair actions performed on the vehicles. The data is also stored in the master data base 104. As indicated, the technician terminals may be connected directly to the host via a network. Statistical analysis programs are used to correlate the readings taken during problem analysis and isolation against the actual repair actions performed. Based on the results of the analysis the signature tables, the isolation sequence tables and the probe test tables are updated to reflect this later level of "learning". The updated tables are distributed to all technician terminals over the network. The network is also used to provide updates of new or revised programs and display panels.

Figure 9:
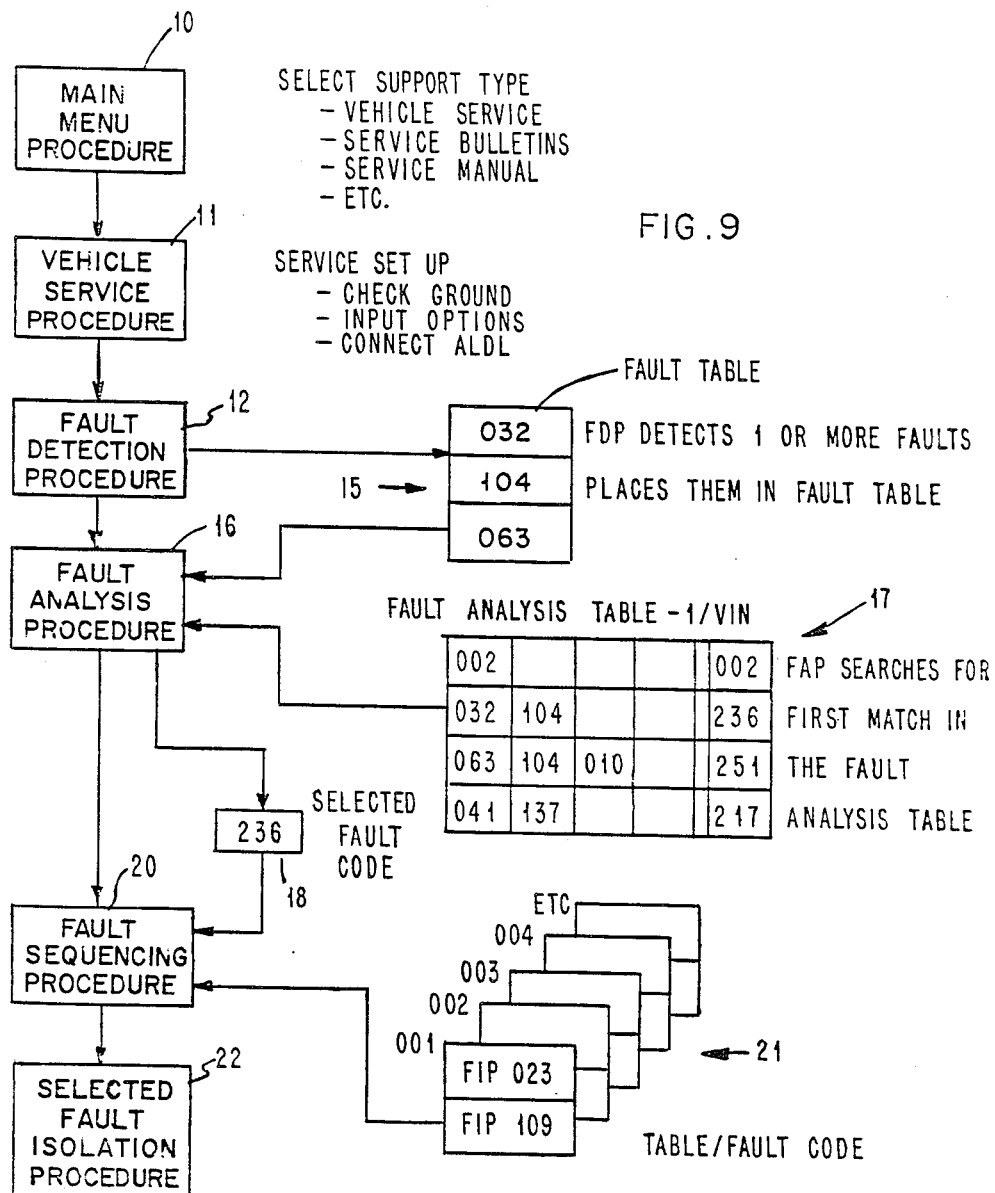
FIG. 9 illustrates the diagnostic procedures described herein.

The system procedure is illustrated in the flow chart shown in FIG. 9 and an alternative procedure makes use of tables shown in FIG. 10A, B, and C.

Figure 12:
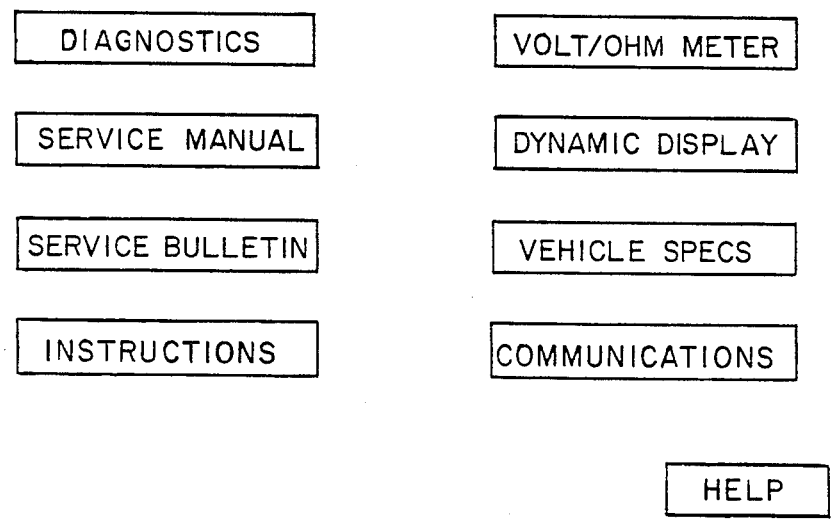
FIG. 12 shows a main menu screen displayed on a technician terminal monitor. (Same drawing sheet as FIG. 7)

The Main Menu Procedure 10 is active whenever the terminal is powered on but not in use. It displays the main menu on the monitor from which the technician selects the type of support desired. A typical main menu is shown in FIG. 12. (Same drawing sheet as FIG. 7). This includes Vehicle Service Procedure (VSP) 11 which leads the technician through the set up steps required for any service. These include:

Validate vehicle power and ground systems
Connect ALDL cable to the vehicle
Input (VIN) the vehicle identification number
Identify certain vehicle options The Fault Detection Procedure 12 (FDP) detects vehicle malfunctions by interrogating data received (via the ALDL) from the on-board computer. The data is read during different vehicle states.

Ignition on (not running)
Engine cranking
Engine idling
Engine at 2500 RPM

The data read represents the state of the various switches, sensors and actuators on the vehicle. The values read from each of the components are compared against known good parameters which are unique to the vehicle under test as, identified by the VIN. Values from the components are correlated to establish that, even though they are within limits, they are also correct relative to the state of the vehicle and relative to the values read from other components having interdependencies.

All faults detected during this procedure are placed in table 15 and control is passed to the next hierarchical procedure. Each fault type is defined by a fault code.

The Fault Analysis Procedure 16 (FAP), using the fault codes from the tables 15 as arguments, does a sequential compare against the contents of the Fault Analysis Table 17. Each entry in this table contains one or more fault codes. Multiple codes in an entry represent a set that when detected concurrently indicate a specific component malfunction as being the most probable cause. A different fault code is assigned to each code set.

The Fault Analysis Table 17 is continuously updated by the network host computer and redistributed to all terminals in the network on some periodic basis, such as daily, but overnight so as to have minimum effect on system availability. The updates to the tables are based upon statistical analysis of all Service Incident Reports (SIR) that have been stored in the host data base since the last update period. A SIR is generated and sent to the host for each repair action performed on a vehicle.

Each SIR contains the VIN, detected fault codes, component readings and repair action taken. This mechanism, over time, increased the probability of finding and correcting the malfunctioning part on the first pass through the fault analysis table since the table is ordered based on frequency of success relative to the codes.

The search of the table continues until an entry is found whose fault codes match one or more of those passed by the FDP. The fault code found such as "236" at block 18 in that entry is passed to the next hierarchical procedure.

In the Fault Sequencing Procedure 20 (FSP), for each fault code passed by the FAP, there is a list in the form of tables 21 containing the name(s) of one or more isolation procedures. These lists are also updated by the host system to reflect the results of statistical analysis of service histories. Each procedure name in the list represents a component that has required a repair action when the related fault code was detected. If the list contains more than one name, they are ordered based upon frequency of cause.

The FSP 20 causes the procedure named at the top of the list to execute at the next hierarchical level. The FAP and FSP procedures in blocks 16 and 20 may be combined into one procedure, if desired and only one table may be set up to accommodate the data stored in tables 17 and 21.

The combining of the Fault Analysis Procedure (FAP) and the Fault Sequencing Procedure (FSP) into one procedure called the Fault Analysis Procedure makes use of the tables shown in FIGS. 10A, B, and C. The Fault Analysis Procedure:

1. Sorts the fault codes in the fault table, 15a, FIG. 10A.
3. Searches the fault analysis table 17a, FIG. 10B for a line where all of the fault codes in that line are listed in the fault table.
3. When a match is found then the FIPs listed in the Fault Analysis Table 17a are executed in order, table 21a, FIG. 10C.
4. Checks to see if it has already executed that FIP. If it has then the FIP is not executed a second time.
5. Continues to execute the FIPs on matching line in the Fault Analysis Table 17a until the problem is fixed or there are no more FIPs to execute.
6. If the problem is found and repaired the control is passed back to the Fault Detection Procedure 12, FIG. 9, so it can recheck for faults.
7. If none of the FIPs listed on the line in the Fault Analysis Table 17a solve the problem the the FAP goes to the next line in table and looks for matches. (step 2 above).

Given the faults logged in the Fault Table 15a and the associated Fault Analysis Table 17a, the circled FIPs in FIG. 10B would be executed.

A Fault Isolation Procedure as at block 22 (FIP) is executed for the electrical or electronic component on the vehicle the procedure being selected from the group of procedures chosen by FSP 20. These procedures perform a complete test of the related part using the multi-function test proble 160. A complete "black box" analysis of the component is performed. There are, of course, some electrical components such as lights, radio, power windows, door locks, etc. that are not covered by procedures. Many vehicles already have FIPs which cover these components. There are also FIPs for non-electrical components such as throttle linkages, vacuum hoses, fuel system, etc.

This test of components has one of the following results:

The test fails which will cause the FIP to invoke the proper procedure to guide the technician in the repair, replace or adjustment required. When the repair action is completed, the same FIP will re-run the test to validate the fix, then return control to the FDP to determine if the repair action eliminated all the faults found on the initial pass. If not, then the same scenario is again followed.

If the test completes with no failures, the FIP returns control to the FAP which selects the next FIP named in the list and another suspected component is tested. If there are no other FIP names in the list, the FAP continues to search the fault analysis table till another match is found. This scenario is repeated until all faults have been eliminated.

Thus, the fault repair procedures guide the technician through the proper steps to accomplish the repair, replacement or adjustment required. This guidance is provided by sequences of display panels containing such things as adjustment procedures, part locations, removal sequences, etc.

In the event that no trouble is found after having exercised all the FIPs that were invoked relative to the detected faults, communication may be established through the network to the host system 105, and the fault codes detected, along with user defined symptoms, are transmitted to the data base 104. Host resident programs interrogate the service history files and transmit back to the terminal additional fault isolation procedures to be tried.

Figure 11:
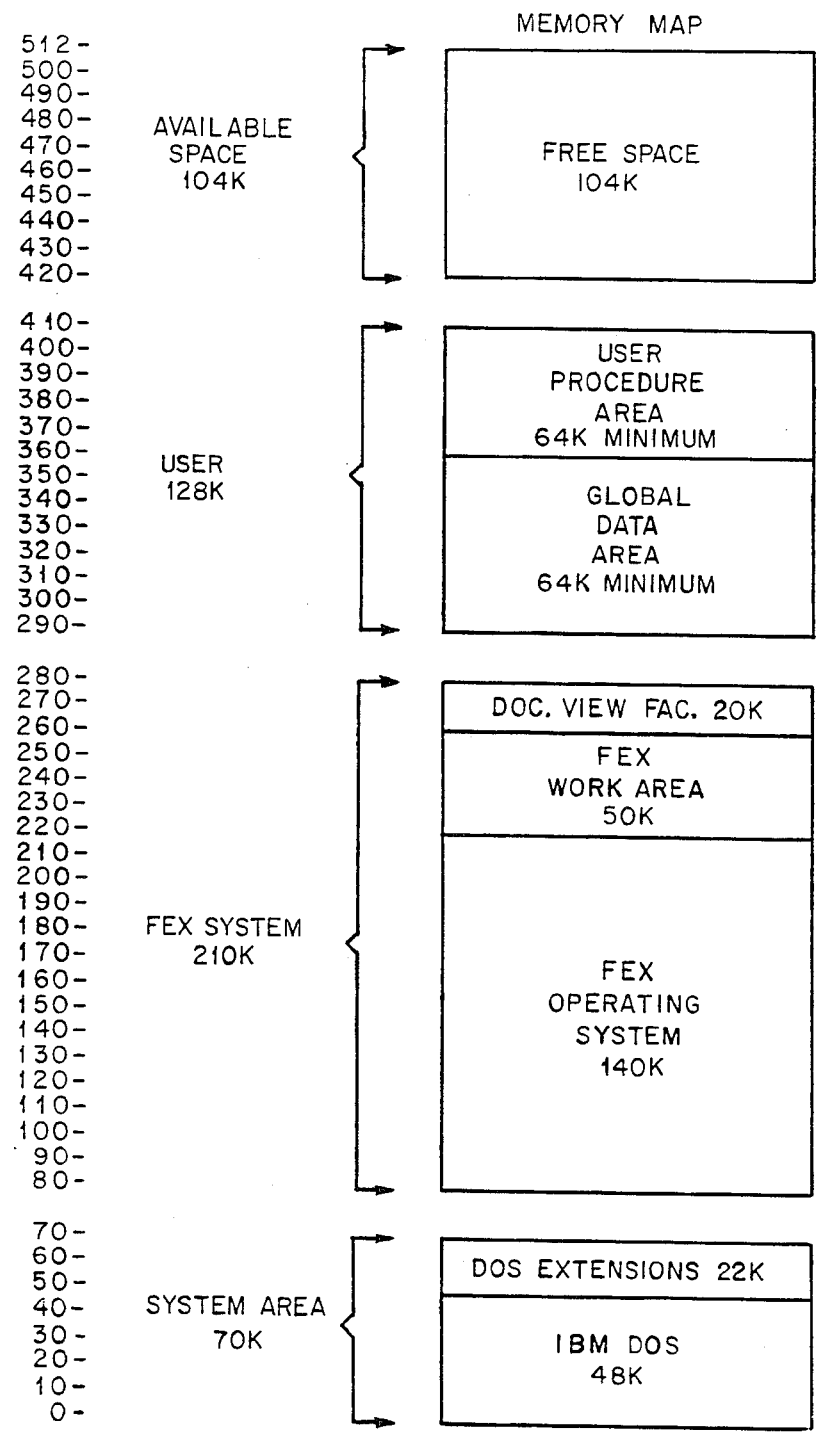
FIG. 11 shows a typical utilization of the storage in the technician terminal computer, a memory map for the software execution system.

FIG. 11 illustrates a memory map assignment in PC AT controller 150, FIG. 4, for the programs used to accomplish the procedures just set forth in connection with FIG. 9.

Figure 13:
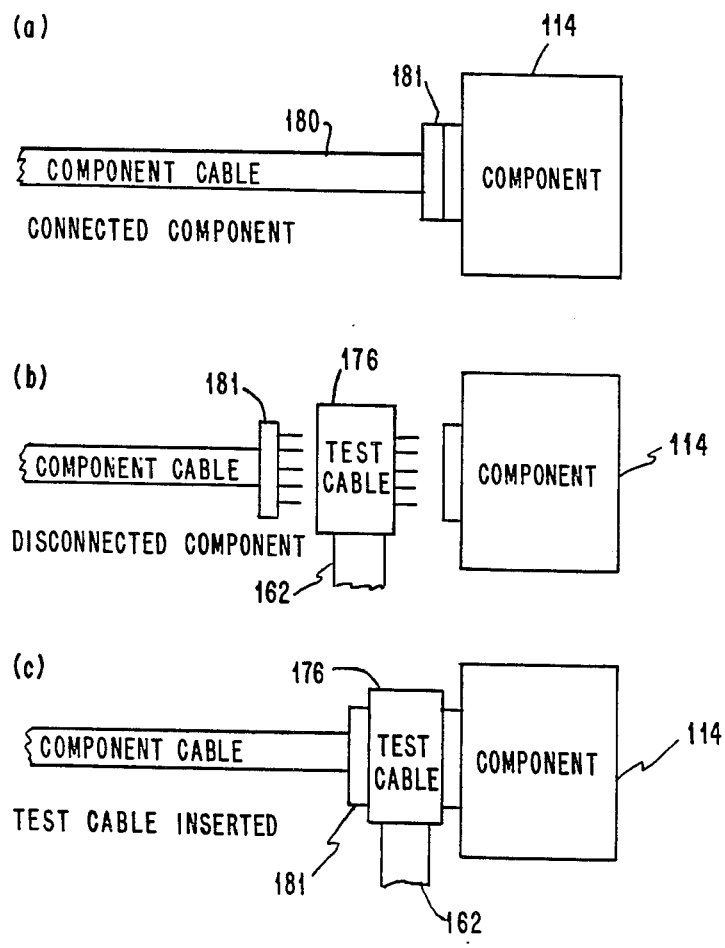
FIG. 13 shows a three step sequence (a), (b) and (c) that is typical of probe utilization.

FIG. 13, as well as FIGS. 8A and 8B illustrate the attachment of the test probe cable to a component such as component 114 in steps (a), (b) and (c). As previously noted ECM 110 is normally connected to component 114 by way of cable 180 and connector 181 as at (a). The test probe 160 in FIG. 6 consists of a multiple conductor cable 161, 162 which is attached to the probe controller in the terminal and terminated externally at a zero force insertion type connector. The attachment of the probe to the component to be tested is accomplished by use of the cable having a component connector 176 on one end and a connector 177 which mates with the test probe head on the other end. As noted, this cable is called a vehicle probe interface (VPI). The component connector 176 of the VPI cable is inserted in line with the component to be tested (a) and (b) and the other connector is plugged into the probe head.

The probe can also be used for attaching external electronic instruments which have a digital interface. A vacuum gauge, pressure gauge or acoustic sensor are some examples.

Figure 14:
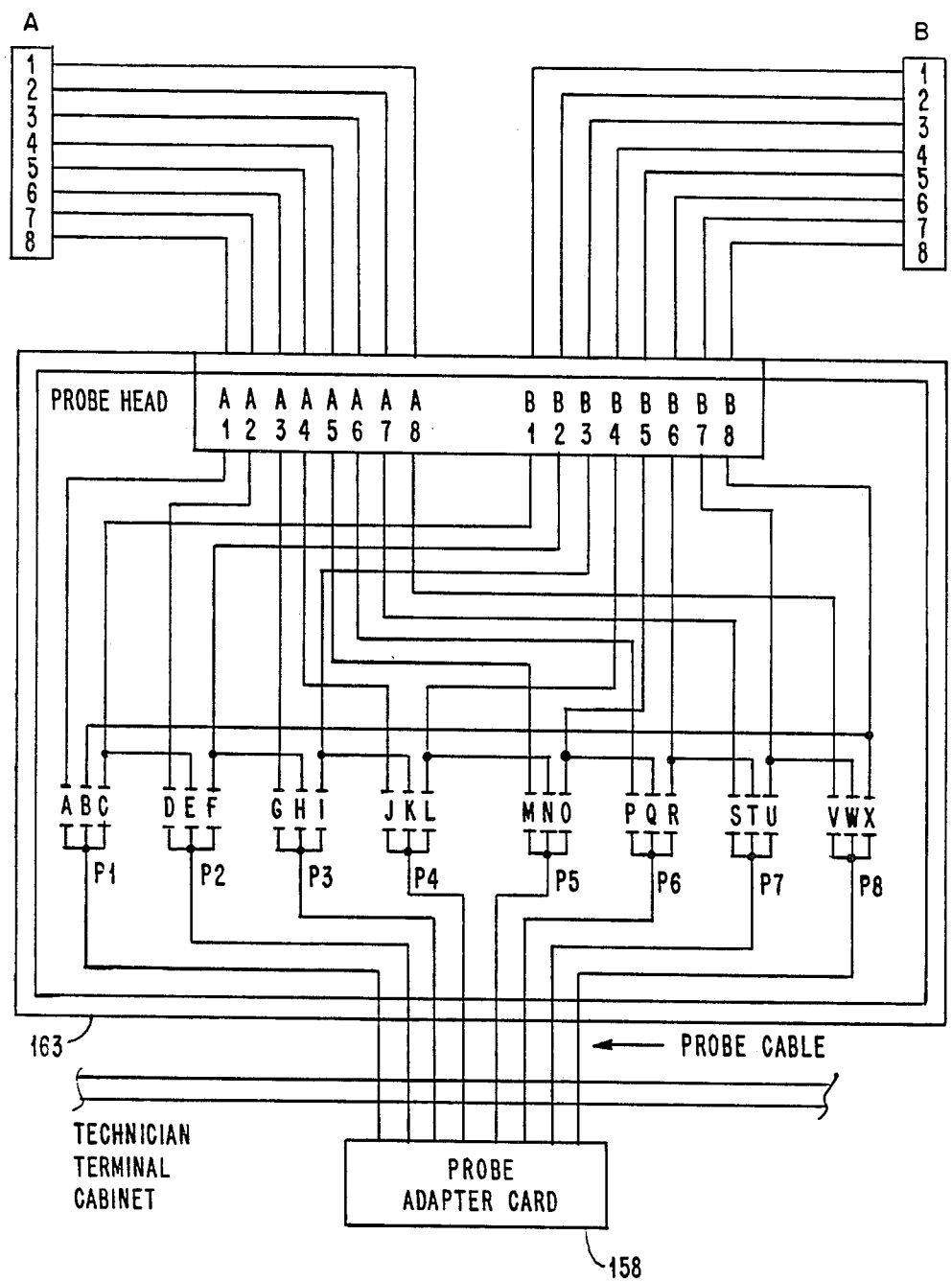
FIG. 14 is a schematic view of probe head wiring.

FIG. 14 is a schematic view of the test probe head wiring. Housed in the probe head 163 are switches P1-P8 controlled by the probe adapter card 158 (FIG. 4) which allows the test connection to be made only to the component isolated from the component cable or to the cable only, isolated from the component, or as a splice into a connected non-isolated circuit. The conductors can be switched individually or gang switched.

Figure 15:
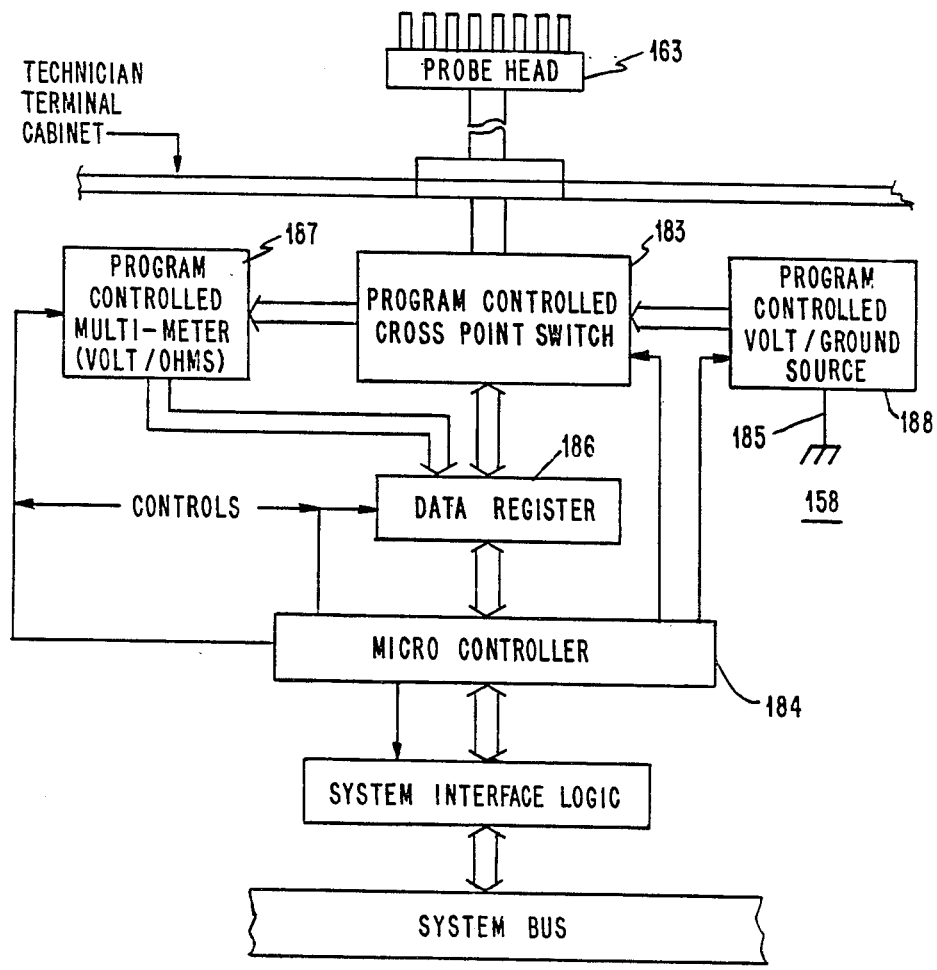
FIG. 15 shows a probe controller card for interfacing the probe to the computer in the technician terminal.

The probe adapter card incorporating a probe controller is shown in block diagram in FIG. 15. It attaches to the computer in the terminal and is supported as an I/O device. When the probe cable enters the terminal the conductors contained within it are fed into a programmable crosspoint switch 183 which is controlled by the micro-controller 184. This provides the capability to attach any conductor to any of the test functions provided by the analog/digital logic. In addition to the probe there is a single conductor cable 185 which connects the ground of the probe controller to the vehicle ground. This is to insure that the readings taken by the probe are referenced to the same ground that the on-board computer sees. The adapter card 158 also has a data register 186.

Test functions are provided by three programmable resources in the controller.

1. A program controlled multimeter 187 capable of measuring at least voltage and resistance by use of the programmable crosspoint switch can be connected to any pair of probe conductors or to a probe conductor and ground. The multimeter is capable of:
   Reading resistance
   Reading DC voltage
   Reading a pulse width modulated signal (PWM). To support this requirement a pair of timers are used in conjunction with the multimeter. The meter measures the amplitude of the PWM signal read and the timers provide the frequency and percent duty cycle.
   Reading the timing between two pulsed signals. This requirement also uses the timers.

2. A program controlled DC voltage source and ground sink 188 by use of the programmable crosspoint switch can be connected to any probe conductor. This resource is capable of:
   Sourcing a DC voltage
   Sourcing a PWM signal
   Three types of PWM signals can be generated.
   Type 1—Voltage to Ground
   Type 2—Voltage to Open
   Type 3—Open to Ground
   Apply ground. Any conductor can be connected to ground to sink current from the component being tested.

When the programmable crosspoint switch is set up to connect the probe cable connectors directly to the data register 186, digitized values can be read from any electronic instrument that is plugged into the probe head. Digital data can also be written to the instrument. This allows test parameters to be passed such as range settings, sample timing, etc.

3. The microcontroller 184 provides the following functions:
   Receives and interprets set up and test commands from the processor.
   Controls the various probe elements based upon the test command received.
   Estabishes the connection of probe conductors to the component under test by control of the switches in the probe head.
   Controls application of specified functions to specified probe conductors. This is accomplished by setting up the crosspoint switch, selecting modes of the multimeter and/or selecting the proper source to be applied.
   For read type functions, returns the results to the processor.
   Returns status to the processor for all test commands.
   Controls the time that signals or ground are applied based on a parameter in the test command.

The test commands that can be performed by the probe controller are:
   Read D/C Voltage
      A D/C voltage reading can be taken from any conductor to ground or between any two conductors to get a signed differential reading,
   Read Resistance
      A resistance reading can be taken from any conductor to ground or between any two conductors to get a differential reading.
   Read Pulse Width Modulated Signal Amplitude
      Amplitude of a pulse width modulated signal can be read from any conductor.
   Read Pulse Width Modulated Signal Frequency
      Frequency of a pulse width modulated signal can be read from any conductor.
   Read Pulse Width Modulated signal % Duty Cycle
      Duty cycle of a pulse width modulated signal can be read from any conductor.
      A=Up time of signal $\_A\_ \times 100 = \%$ Duty Cycle
      B=Down time of signal A+B
   Read Timing Between Pulsed Signals
      The timing between the pulsed signals on any two conductors can be read. The trigger points for each signal are separately defined and can be either a plus or minus going slope.
   Source D/C Volts
      A steady state D/C voltage can be applied to one or more conductors. The level of voltage to be applied is programmable.
   Remove D/C Volts
      This command removes the voltage that has been applied.
   Apply Ground
      One or more conductors can be connected to ground providing a current sink.
   Remove Ground
      This command removes the ground that has been applied.
   Source PWM Signal
      A PWM signal can be specified and then sourced to one or more conductors. There are three types of PWM signals. Voltage/Ground, Voltage/Open, and Ground/Open. All three types are programmable relative to frequency and duty cycle. The first two require amplitude to be specified also.
   Remove PWM Signal
      This command removes the PWM signal that has been applied.
   Read Digital
      This command is used to read data from external electronic test equipment that convert non-electrical parameters into digital representation.
   Write Digital
      This command is used to write digital data to external electronic test equipment.

A test table, FIG. 16, is utilized for each component type to be tested. Entries in the table have a fixed format. Each entry contains all the parameters needed to apply a voltage, signal or ground, or to read a voltage, signal or resistance depending upon the test function being defined by the entry.

For the Read type tests, the values read are compared against high and low signature values contained in the entry. The results of this comparison determine whether the test step passed or failed. Other parameters allow an AND or OR mask to be applied against the value read and the result used in the compare against the signatures.

A test table can be structured into test groups. This allows a return to the test procedure so that the technician can be instructed to change the probe connections at the component or change the state of the component for power on, power off, run, stop, etc.

A test group can in turn be subdivided into sub-test modules. Decision type parameters can be specified in table entries that allow "branching" to another sub-test or returning to the test procedure based upon the results of the test performed by the module. A mechanism is provided to stimulate a component connected to the probe, and then in a test step, request an ALDL frame to determine if an expected action occurred.

Test table entries each contain 12 fields. The contents of some fields vary as a function of the command code in the entry. Some fields are not used for certain commands.

The test table entry field definitions are shown in the format of FIG. 16.

Field 1 (Label)—Label name of the entry. Used for test table entry and branch within the table.

Field 2 (CMD)—Command code. Identifies a test to be performed or defines a delimeter. See "Test Commands" above for list of commands that can be used. Two codes are used to specify Read ALDL. Code assignments are an implementers choice except for four which are defined as:

"000"—NO-OP No test is performed
"253"—Last entry of a sub-test
"254"—Last entry of a test group
"255"—Last entry of the test table Field 3 (C1)—The contents of the field are command dependent.

For commands except Remove Source, Read ALDL Byte, Read ALDL Bit and Read Digital it specifies a probe conductor to be used in this test.

For Remove Souce it specifies a single conductor or all that have had ground applied or voltage or signal sourced.

For Read ALDL Byte or Read ALDL Bit it specifies the byte to be returned from the ALDL data frame read.

For Read Digital it is not used.

Field 4 (C2)—The contents of this field are command dependent.

For Read Voltage, Read Resistance and Read Timing commands it specifies the second conductor to be used during this test.

For Source Voltage it specifies level of voltage.

For Source PWM Signal it specifies the type of PWM signal.

For Read ALDL Bit the logic to be used, "AND" or "OR", when applying the mask in field 8 against the ALDL byte returned is specified.

Field 5 (Time)—Specifies a time period in milliseconds from 00000 to 65535.

For Read B=Voltage and Read Resistance type commands it is the time to wait after the connection is made before taking the reading. This allows for active components to stabilize.

For Source Voltage, Source PWM Signal or Apply Ground commands it defines a time out to terminate the action if a Remove or another command to the same conductor is not received first.

Field 6 (Slope)—Used for the reading and timing between two pulsed signals. It specifies which slope, plus or minus going, should be used for time triggering.

T1 minus, T2 plus
T1 plus, T2 minus
Both plus
Both minus

Field 7 (Result)—Field into which the results are returned for all "read" type commands. For a Source PWM Signal command it specifies the amplitude of the signal to be sourced.

Field 8 (Logic)—This field contains the low signature value to be used in the compare operation against the result value returned in field 7 for all read type commands except Read ALDL Bit, in which case it is not used. For source PWM command it specifies the % duty cycle of the signal to be sourced.

Field 10 (Entry)—this field contains the Label name of the table entry to be executed next if the test in this entry failed and the value in Field 12 is "003". (See definition of Field 12 below).

Field 11 (PRCNAME)—This field contains the name of a Procedure to be invoked if the test in this entry failed and the value in field 12 is "002".

Field 12 (SEQCODE)—This field contains a value which is used in conjunction with fields 10 and 11 to establish the sequence of testing beyond this point as a function of the results of the test in this entry.

"000"—Continue with next sequential entry in the table.

"001"—If the test in this entry fails return control to the procedure that initiated the test table.

"002"—If the test in this entry fails the procedure named in Field 11 is invoked.

"003"—If the test in this entry fails the test will continue at the table entry whose label name is in Field 10 of this entry.

Notes for FIG. 16:

*—A parameter must be specified.
—A parameter must be specified if the code in field 12 is *not* "000".

A separate fault isolation procedure (FIP) is required in conjunction with a unique test table for each component to be tested. The FIP using display messages gives the technician instructions for:

Connecting the component unique connector.
Setting and changing the state of the component.
Manually operating a component when applicable.

The FIP calls for probe system services when a test is ready to be executed. For each call the name of the test table and an entry point into the table is passed.

Control is returned to the FIP whenever the last entry of a test group or the end of the table has occurred with no failures encountered. Between test groups the FIP will instruct the technician to change a connection or change the state, then another "call" is made passing the entry point of another group test. When certain tests fail the test table can be "programmed" to return control to the FIP.

Some tests that fail will cause another procedure to be invoked. The invoked procedure will lead the technician through the proper replace, repair or adjust action.

While a preferred embodiment of the invention has been illustrated and described, it is to be understood that there is no intention to limit the invention to the precise construction herein disclosed and the right is reserved to all changes and modifications coming within the scope of the invention as defined in the appended claims.

We claim:

1. A diagnostic method for utilizing a probe in diagnosing a vehicle in conjunction with a diagnostic system, the vehicle having an on-board computer control system for monitoring and controlling vehicle functions and the diagnostic system including a technician terminal having a diagnostic microprocessor for processing diagnostic signals representative of vehicle conditions, said microprocessor having data entry means, data output means and storage means for storing vehicle parameters and diagnostic routines and said technician terminal having a display means for providing instructions for fault repair sequences, and said technician terminal utilizing diagnostic procedures to determine vehicle faults consisting of displaying a menu of diagnostic routines including connection of the vehicle to said terminal and identification of said vehicle and vehicle options, utilizing a Fault Detection Procedure, a Fault Analysis Procedure, to detect faults and to select one or more Fault Isolation Procedures to provide guidance relative to repairing, replacing or adjusting vehicle components, said method comprising the steps of:

(1) interconnecting a probe cable having an interposer connector in line between said on-board computer and a component to be tested, said probe cable having a plurality of conductors and a cross-point switch;

(2) providing a probe adapter card for interconnecting said probe cable with said technician terminal diagnostic microprocessor and said probe via a probe controller, and said probe controller incorporating a program controlled Multimeter, a program controlled DC Voltage Source and Ground Sink and a probe Micro-controller; and (3) activating said Multimeter, said Voltage Source and Ground Sink and said Microcontroller in a sequence of steps under control of commands generated by said diagnostic computer to perform test functions on said component.

2. The method of claim 1 further comprising the step of:

(4) activating said probe cross-point switch on a selective basis to establish connection of selected ones of said probe conductors to a component under test.

3. The method of claim 1 further comprising the step of:

(4) utilizing said probe multimeter for one or more functions relative to a component under test including reading resistance, reading voltage, reading a pulse width modulated signal, and reading the timing between two pulses.

4. The method of claim 1 further comprising the step of:

(4) activating said program controlled DC voltage source and ground sink to apply a variety of signal conditions to a component under test via said cross-point switch on a selective basis including DC voltage, PWM signal in (1) voltage to ground (2) voltage to open and (3) open to ground, and application of ground.

5. The method of claim 1 further comprising the step of:

(4) activating said probe microcontroller responsive to commands from said diagnostic microprocessor on a selective basis to control the various probe elements, control the cross-point switches, control application of specific functions to specified probe conductors, return result signals and status sequencing to said diagnostic microprocessor and control timing of signals.

6. The method of claim 1 wherein the Fault Analysis Procedure is conducted in two substeps comprising an alternative Fault Analysis Procedure followed by a Fault Sequencing Procedure.

* * * * *